United States Patent
Tseng

(10) Patent No.: US 10,944,255 B2
(45) Date of Patent: Mar. 9, 2021

(54) ULTRA LOW CAPACITANCE TRANSIENT VOLTAGE SUPPRESSOR

(71) Applicant: AMAZING MICROELECTRONIC CORP., New Taipei (TW)

(72) Inventor: Yiming Tseng, Zhubei (TW)

(73) Assignee: Amazing Microelectronic Corp., New Taipei (TW)

( * ) Notice: Subject to any disclaimer, the term of this patent is extended or adjusted under 35 U.S.C. 154(b) by 338 days.

(21) Appl. No.: 16/128,854

(22) Filed: Sep. 12, 2018

(65) Prior Publication Data

US 2020/0083703 A1    Mar. 12, 2020

(51) Int. Cl.
*H02H 9/04* (2006.01)
(52) U.S. Cl.
CPC .................... *H02H 9/044* (2013.01)
(58) Field of Classification Search
CPC ........................................................... H02H 9/044
See application file for complete search history.

(56) References Cited

U.S. PATENT DOCUMENTS

| 8,169,000 | B2 | 5/2012 | Chuang et al. | |
|---|---|---|---|---|
| 2003/0058592 | A1* | 3/2003 | Hung | H01L 27/0262 361/56 |
| 2014/0015008 | A1* | 1/2014 | Huang | H01L 29/0649 257/173 |
| 2015/0207312 | A1 | 7/2015 | Wang et al. | |
| 2017/0302072 | A1* | 10/2017 | Chen | H02H 9/04 |

FOREIGN PATENT DOCUMENTS

| CN | 103296665 A | 9/2013 |
|---|---|---|
| CN | 107301991 A | 10/2017 |
| EP | 2410566 A1 | 1/2012 |
| TW | 201216447 A1 | 4/2012 |

OTHER PUBLICATIONS

International Search/Examination Report dated Oct. 9, 2020, for Foreign Application No. 201910137948.4.

* cited by examiner

*Primary Examiner* — Scott Bauer
(74) *Attorney, Agent, or Firm* — Rosenberg, Klein & Lee

(57) ABSTRACT

A multi-channel transient voltage suppressor with ultra-low capacitance is provided, which comprises a plurality of diode strings coupled between an ESD bus line and ground, having each diode string coupled to an I/O pin; a power clamp circuit coupled to the ESD bus line; and a first diode having an anode coupled to the power clamp circuit and a cathode coupled to ground. A second diode may be alternatively disposed between the first diode and the diode strings, having an anode coupled to the ground and a cathode coupled to a common anode of the diode strings. By employing the proposed present invention, it is advantageous of reaching an ultra-low capacitance and meanwhile still maintaining a lower layout area of the circuit structure.

6 Claims, 11 Drawing Sheets

ULTRA LOW CAPACITANCE TRANSIENT VOLTAGE SUPPRESSOR

BACKGROUND OF THE INVENTION

Field of the Invention

The present invention relates to a transient voltage suppressor structure, and more particularly to a multi-channel transient voltage suppressor with ultra-low capacitance.

Description of the Prior Art

With rapid development of today's technology, integrated circuits have been widely applied in electronic devices. As shown in FIG. 1, ESD (Electrostatic Discharge) protector 1 is one of the major necessities in the field of integrated circuits for preventing the device to be protected 2 from an ESD event, and has been well known by person skilled in the art. The device to be protected 2 such as core circuits, are prone to damage caused by the ESD event.

In a conventional technical field, transient voltage suppressors (TVS) are usually used to conduct an ESD current. Please refer to FIG. 2, which illustrates a circuit diagram of a conventional transient voltage suppressor using the uni-directional TVS design. A transient voltage suppressor 200 comprises a zener diode Z1 and a plurality of diodes D1. However, with the traditional uni-directional TVS design, it is very difficult to further reduce the capacitance. To solve the high-capacitance issue, FIG. 3 illustrates a circuit diagram of a transient voltage suppressor using the cascade diodes. It is apparent that a lower capacitance can be accomplished by cascading the diodes D1. Nevertheless, as the number of channels of the transient voltage suppressor increases, the diodes D1 additionally arranged on each channel may cause a larger circuit area required by the transient voltage suppressor and thereby dramatically increase circuit costs. In other words, FIG. 3 somehow requires much more layout area and higher cost, especially when applied to multi-channel TVS applications.

FIG. 4 illustrates a circuit diagram of a conventional transient voltage suppressor using a bi-directional TVS design. As shown in FIG. 4, it may result in a smaller capacitance value to overcome the high-capacitance issue, however, its negative clamp voltage increases significantly instead. As such, by using the bi-directional TVS design, its ability to protect the back-end circuit will be reduced on the other hand.

Therefore, on account of above, to overcome the above-mentioned problems, it should be obvious that there is indeed an urgent need for the professionals in the field for a new multi-channel transient voltage suppressor with ultra-low capacitance to be developed that can effectively solve those above-mentioned problems occurring in the prior design.

SUMMARY OF THE INVENTION

In order to overcome the above-mentioned disadvantages, one major objective in accordance with the present invention is provided for a transient voltage suppressor, which can be applied to multi-channel design so as to dramatically reduce the capacitance and yet still maintain a lower layout area.

For achieving the above-mentioned objectives, the present invention provides a transient voltage suppressor, which comprises at least one diode string, a power clamp circuit, and a first diode. The at least one diode string is coupled between an ESD bus line and ground, and comprises at least two channel diodes connected in series. An I/O pin is coupled to a terminal where two adjacent channel diodes are connected. The power clamp circuit is coupled to the ESD bus line for ESD protection. An anode of the first diode is coupled to the power clamp circuit and a cathode of the first diode is coupled to ground. The first diode in series with the power clamp circuit is electrically connected with the at least one diode string in parallel.

As such, when a positive pulse is injected, an energy discharge current successively flows from the I/O pin, the channel diode of the diode string, the power clamp circuit and the first diode to ground. While when a negative pulse is injected, the energy discharge current successively flows from ground and the channel diode of the diode string to the I/O pin.

According to an embodiment of the present invention, a second diode can be further disposed between the first diode and the diode string, having its anode coupled to ground and its cathode coupled to an anode of the diode string.

Furthermore, when the present invention is applied to multi-channel design so as to form a multi-channel transient voltage suppressor with ultra-low capacitance, it further comprises a plurality of diode strings, a plurality of I/O pins, a power clamp circuit and a first diode. The plurality of diode strings are coupled between the ESD bus line and ground, and each diode string is connected in parallel with each other and comprises at least two channel diodes connected in series. Each I/O pin is coupled to a terminal where two adjacent channel diodes in each diode string are connected. The power clamp circuit is coupled to the ESD bus line for ESD protection. An anode of the first diode is coupled to the power clamp circuit and a cathode of the first diode is coupled to ground. The first diode in series with the power clamp circuit is electrically connected with the plurality of diode strings in parallel.

In one embodiment, a plurality of second diodes may be additionally disposed. In details, each diode string further comprises one second diode, having its anode coupled to ground and its cathode coupled to an anode of the channel diode.

In order to reduce a large number of second diodes being used, only one second diode may be adopted as well according to other embodiment of the present invention, in which an anode of the second diode is coupled to ground and a cathode of the second diode is coupled to a common anode of the plurality of diode strings.

As a result, it is apparent that the present invention successfully provides a transient voltage suppressor structure and a multi-channel transient voltage suppressor with ultra-low capacitance thereof. For a variety of modifications made to meet different specifications, single second diode or a plurality of them may alternatively be adopted. Thus, the high capacitance issue occurring in the prior art are tremendously solved, meanwhile maintaining a lower layout area and does not increase its negative clamping voltage of the present invention.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
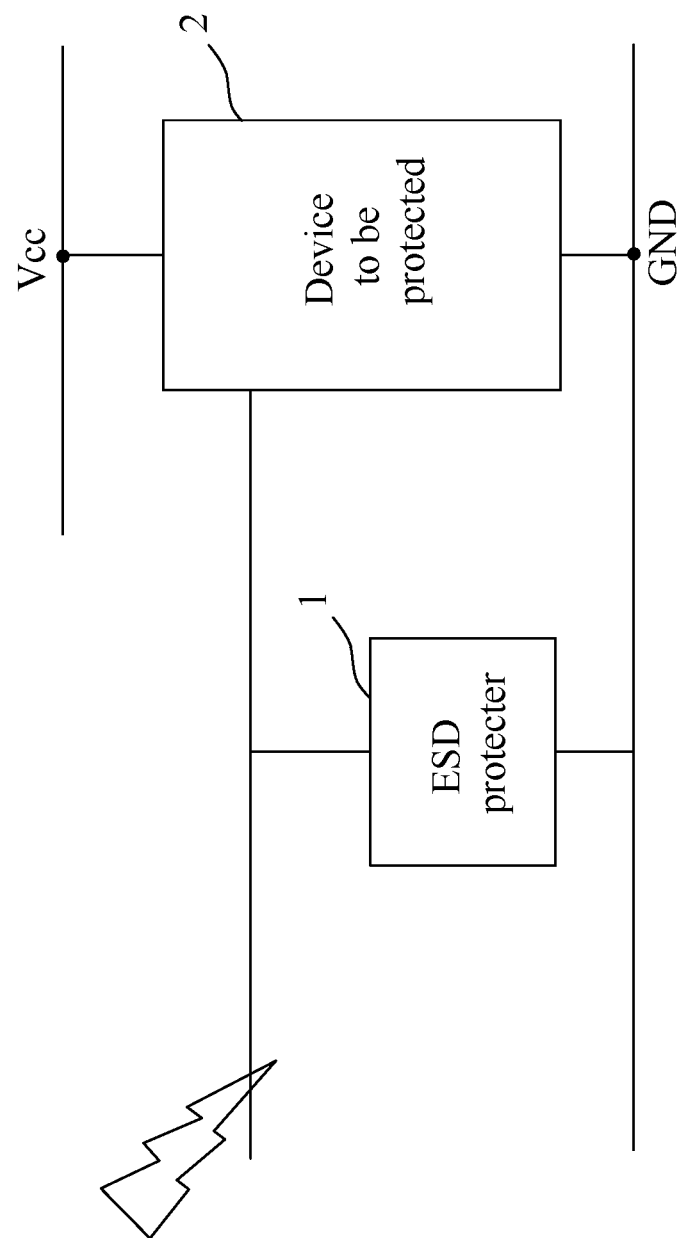
FIG. 1 shows a conventional system level ESD protection scheme in prior arts.
Figure 2:
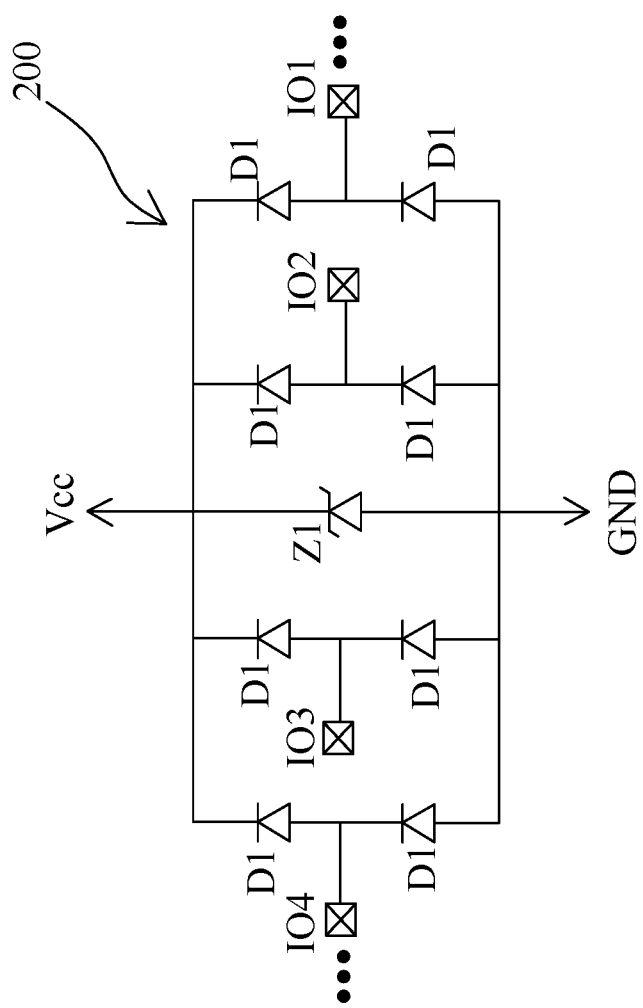
FIG. 2 shows a circuit diagram of a conventional transient voltage suppressor using traditional uni-directional TVS design.
Figure 3:
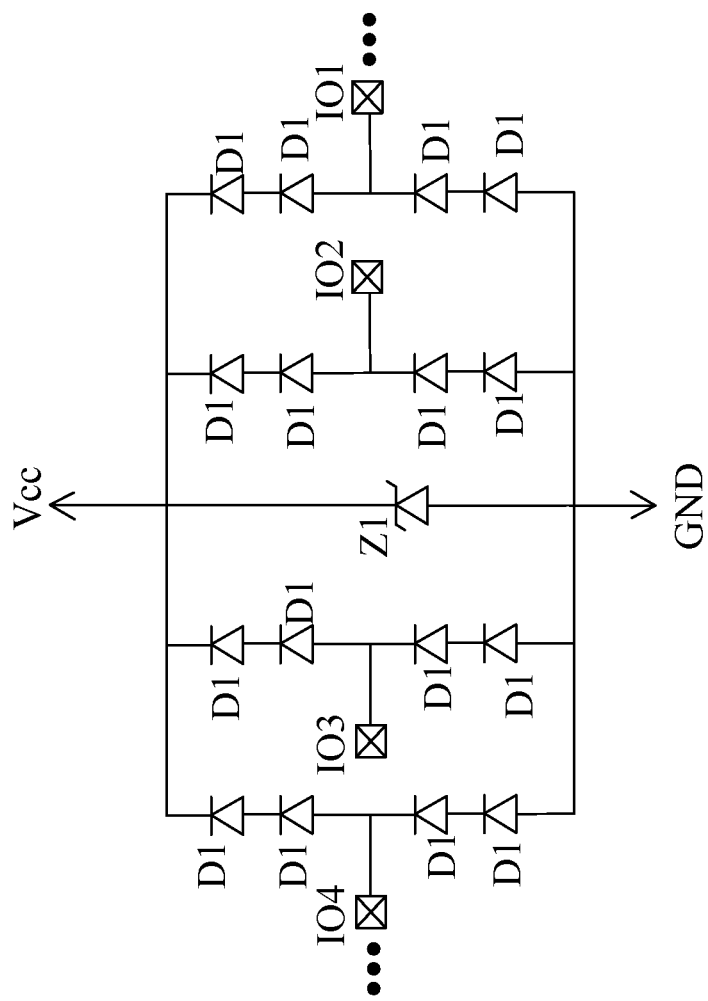
FIG. 3 shows a circuit diagram of a transient voltage suppressor using the cascade diodes.
Figure 4:
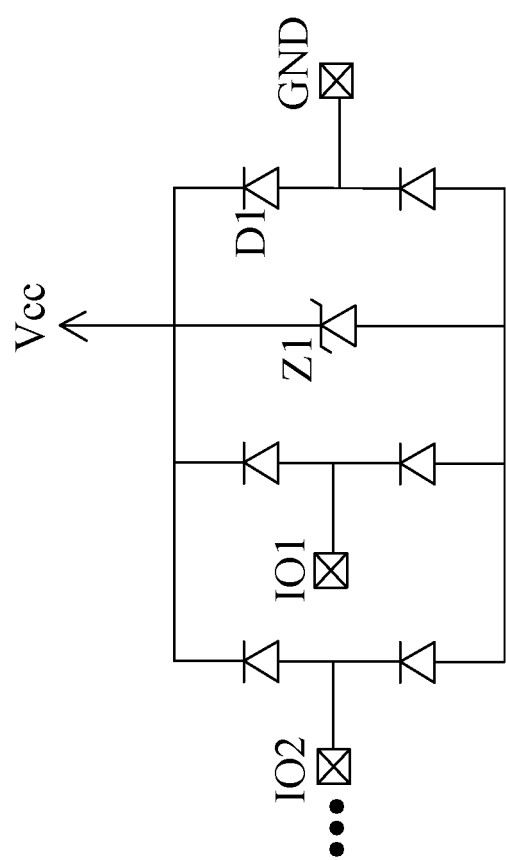
FIG. 4 shows a circuit diagram of a conventional transient voltage suppressor using a bi-directional TVS design.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

The present invention discloses a transient voltage suppressor with ultra-low capacitance which can be applied to multi-channel design while still maintain a small layout area.

Figure 5:
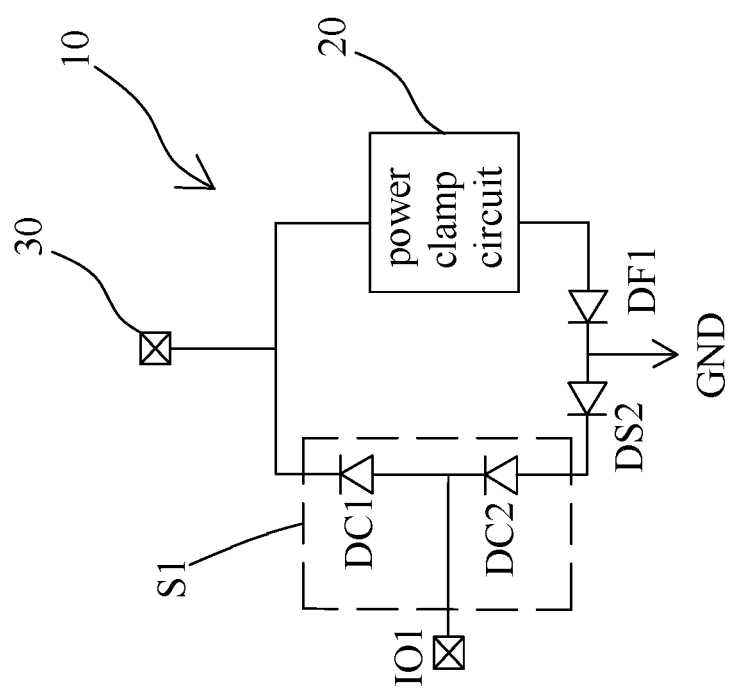
FIG. 5 shows a circuit diagram of a transient voltage suppressor in accordance with a first embodiment of the present invention.

Please refer to FIG. 5 first, which shows a circuit diagram of a transient voltage suppressor in accordance with a first embodiment of the present invention. As shown in FIG. 5, the transient voltage suppressor 10 of the present invention comprises at least one diode string S1, a power clamp circuit 20, a first diode DF1 and a second diode DS2. The diode string S1 is coupled to an ESD bus line 30, and the diode string S1 comprises at least two channel diodes DC1, DC2 which are electrically connected in series.

IO1, indicating as an I/O pin, is coupled to a terminal where two adjacent channel diodes DC1, DC2 are connected for inputting and outputting signals. The power clamp circuit 20 is coupled to the ESD bus line 30 for ESD protection. According to the embodiment of the present invention, the ESD bus line 30 is coupled to a high voltage level (Vcc) or can simply perform as a floating node.

According to the embodiment of the present invention, an anode of the first diode DF1 is coupled to the power clamp circuit 20 and a cathode of the first diode DF1 is coupled to ground GND. Moreover, an anode of the second diode DS2 is coupled to ground GND and a cathode of the second diode DS2 is coupled to the channel diode DC2 of the diode string S1. As such, the first diode DF1 in series with the power clamp circuit 20 is electrically connected with the diode string S1 in series with the second diode DS2 between the ESD bus line 30 and ground GND. When a positive pulse is injected, an energy discharge current successively flows from IO1, the channel diode DC1, the power clamp circuit 20 and the first diode DF1 to ground GND. On the other hand, when a negative pulse is injected, an energy discharge current successively flows from ground GND, the second diode DS2 and the channel diode DC2 of the diode string S1 to the I/O pin IO1.

Figure 6:
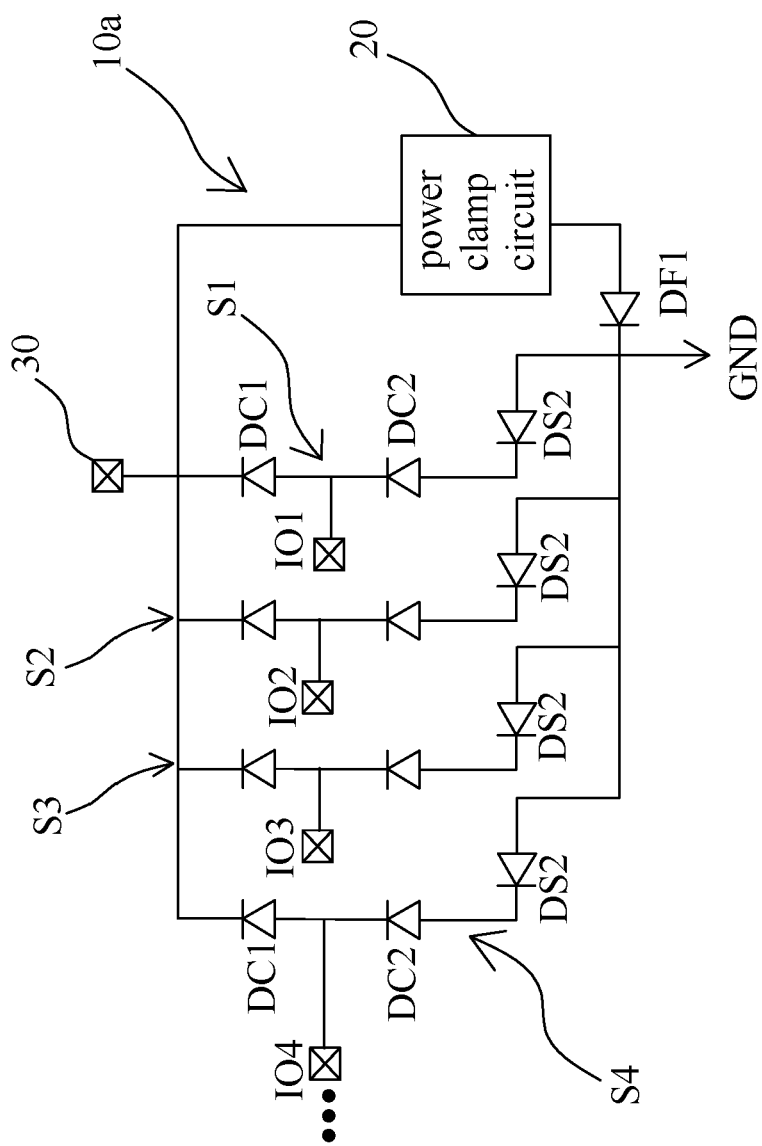
FIG. 6 shows a circuit diagram of a multi-channel transient voltage suppressor with ultra-low capacitance in accordance with a second embodiment of the present invention.

FIG. 6 shows a circuit diagram of a multi-channel transient voltage suppressor in accordance with a second embodiment of the present invention. Compared to the first embodiment as shown in FIG. 5, the second embodiment of the present invention illustrates a multi-channel design, in which a multi-channel transient voltage suppressor 10a is disclosed. The multi-channel transient voltage suppressor 10a comprises a plurality of diode strings S1, S2, S3, S4 . . . , a plurality of I/O pins IO1, IO2, IO3, IO4 . . . , a power clamp circuit 20, a first diode DF1 and a plurality of second diodes DS2.

Each of the diode strings S1, S2, S3, S4 coupled between the ESD bus line 30 and ground GND is connected in parallel with each other and comprises at least two channel diodes DC1, DC2 connected in series.

Each of the I/O pins is coupled to a terminal where two adjacent channel diodes DC1, DC2 in each diode string S1, S2, S3, S4 are connected. For example, the I/O pin IO1 is coupled to the diode string S1; the I/O pin IO2 is coupled to the diode string S2; the I/O pin IO3 is coupled to the diode string S3; and the I/O pin IO4 is coupled to the diode string S4 for inputting and outputting its individual signals.

The power clamp circuit 20 is coupled to the ESD bus line 30 for discharging ESD energy. And, an anode of the first diode DF1 is coupled to the power clamp circuit 20 and a cathode of the first diode DF1 is coupled to ground GND. What differs from the first embodiment as shown in FIG. 5 is that, each diode string S1, S2, S3, S4 in FIG. 6 further comprises a second diode DS2, having an anode coupled to ground GND and a cathode coupled to an anode of each channel diode DC2 of the diode strings S1, S2, S3, S4. Under such arrangements, it is believed that a multi-channel transient voltage suppressor with ultra-low capacitance is accomplished. Nevertheless, it is worth noticing that lower capacitance and more layout area are possibly trade-offs since a plurality of second diodes DS2 are utilized in this circuit structure.

Figure 7:
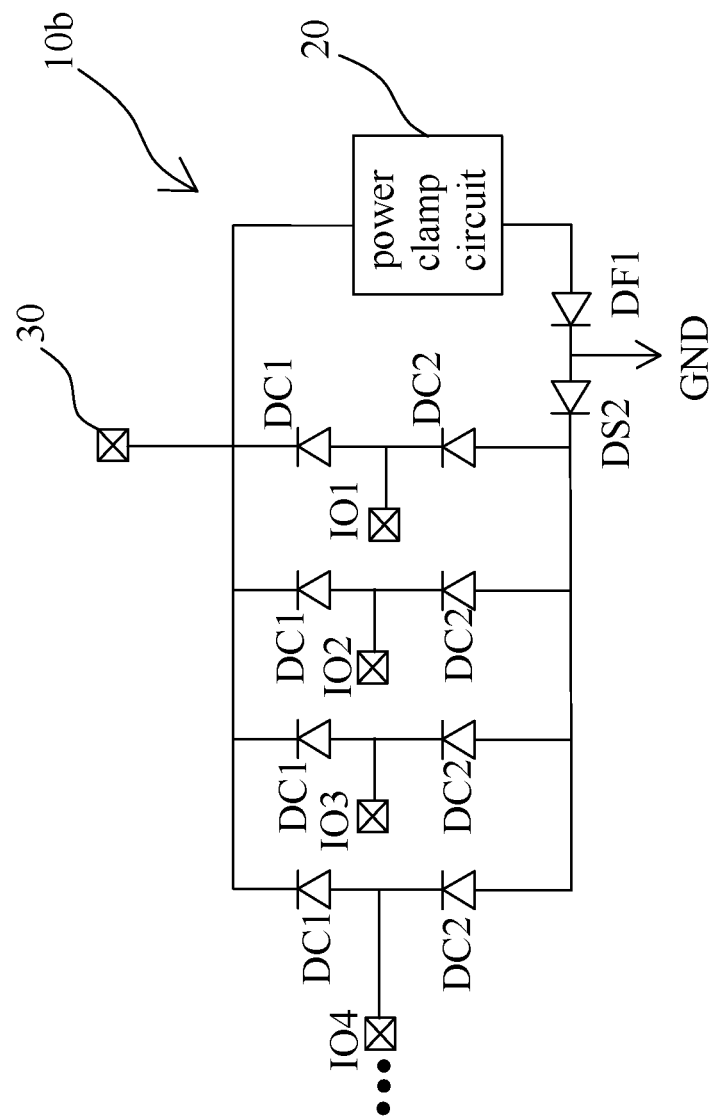
FIG. 7 shows a circuit diagram of a multi-channel transient voltage suppressor with ultra-low capacitance in accordance with a third embodiment of the present invention.

To meet both the goals for "lower capacitance" and "less layout area", a novel scheme as shown in FIG. 7 is further proposed. Please refer to FIG. 7, which shows a circuit diagram of a multi-channel transient voltage suppressor with ultra-low capacitance in accordance with a third embodiment of the present invention. Compared to the second embodiment as shown in FIG. 6, the multi-channel transient voltage suppressor 10b in this third embodiment simply adopts one single second diode DS2, having its anode coupled to ground GND, and its cathode coupled to a common anode of the diode strings S1, S2, S3, S4 so as to dramatically reduce a number of second diodes DS2 used in FIG. 6. As a result, it is obvious that both the goals for "lower capacitance" and "less layout area" are accomplished by the proposed embodiment as shown in FIG. 7.

Figure 8:
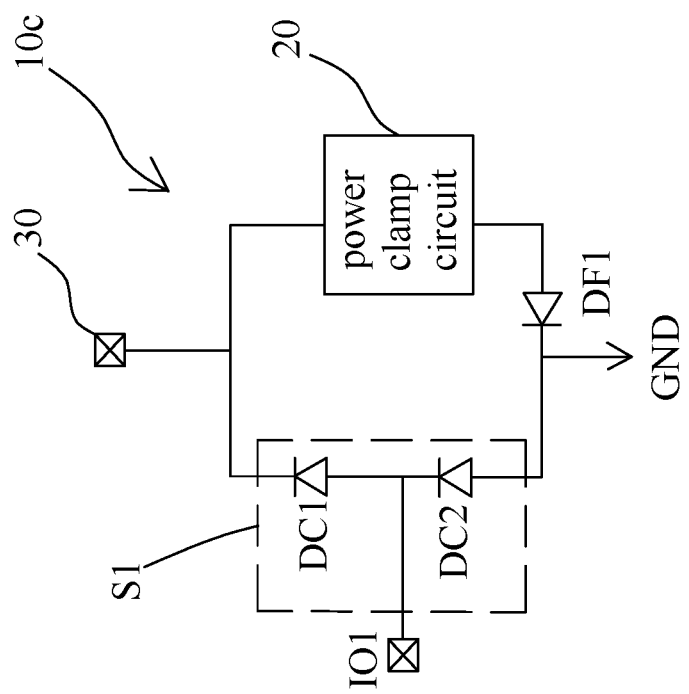
FIG. 8 shows a circuit diagram of a transient voltage suppressor in accordance with a fourth embodiment of the present invention.
Figure 9:
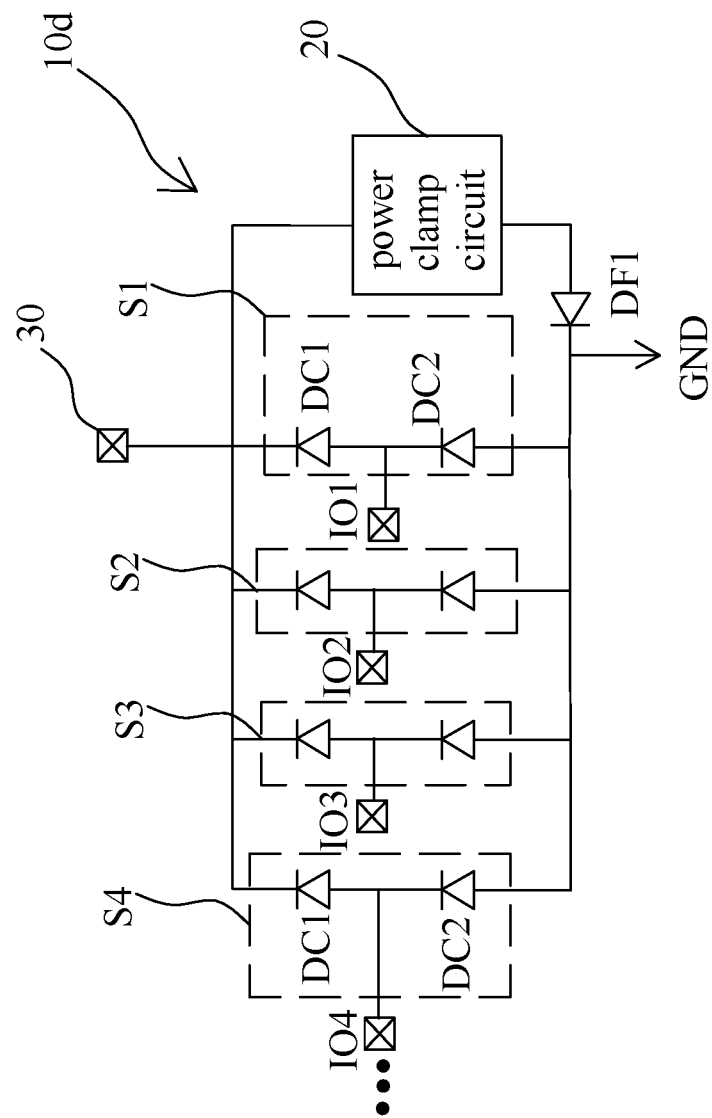
FIG. 9 shows a circuit diagram of a multi-channel transient voltage suppressor in accordance with a fifth embodiment of the present invention.

FIG. 8 and FIG. 9 show a fourth and fifth embodiment of the present invention, respectively, indicating that the second diode DS2 as previously described in the first, second and third embodiments may alternatively be removed as well. FIG. 8 shows a transient voltage suppressor 10c comprising at least one diode string S1, a power clamp circuit 20, and a first diode DF1. The components and elements therein are similar as what we have explained in the first embodiment as shown in FIG. 5 while without the second diode DS2. So the same descriptions will not be repeated hereinafter. FIG. 9 shows a multi-channel transient voltage suppressor 10d which is constructed based on FIG. 8, nevertheless comprising a plurality of diode strings S1, S2, S3, S4 . . . and a plurality of I/O pins IO1, IO2, IO3, IO4 . . . as a multi-channel design.

Figure 10:
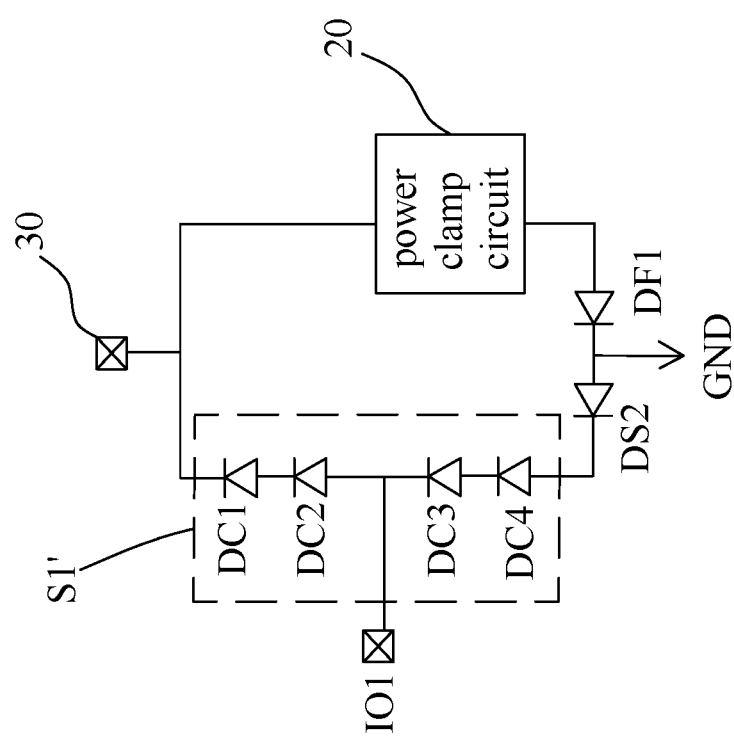
FIG. 10 shows a circuit diagram of a transient voltage suppressor in accordance with a sixth embodiment of the present invention.

In another aspect, according to a sixth embodiment of the present invention, the diode string of the transient voltage suppressor in our invention is not limited to the previously described ones as shown in FIGS. 5, 6, 7, 8, and 9. In other words, the diode string S1' according to a sixth embodiment of the present invention may comprise more than two channel diodes as shown in FIG. 10. In this embodiment, we take four channel diodes for an example. The diode string S1' comprises four channel diodes DC1, DC2, DC3, DC4, and the I/O pin IO1 is disposed at the terminal in a middle of the channel diodes DC1, DC2, DC3, DC4 such that these channel diodes DC1, DC2, DC3, DC4 are divided equally. However the present invention is not limited thereto. Similarly, a scheme that a plurality of channel diodes can be further applied to all the embodiments shown as FIGS. 5, 6, 7, 8, and 9 that we have discussed earlier so as to enable those skilled in the art to understand, make, and use the present invention without departing from the scope or spirit of the invention.

Figure 11:
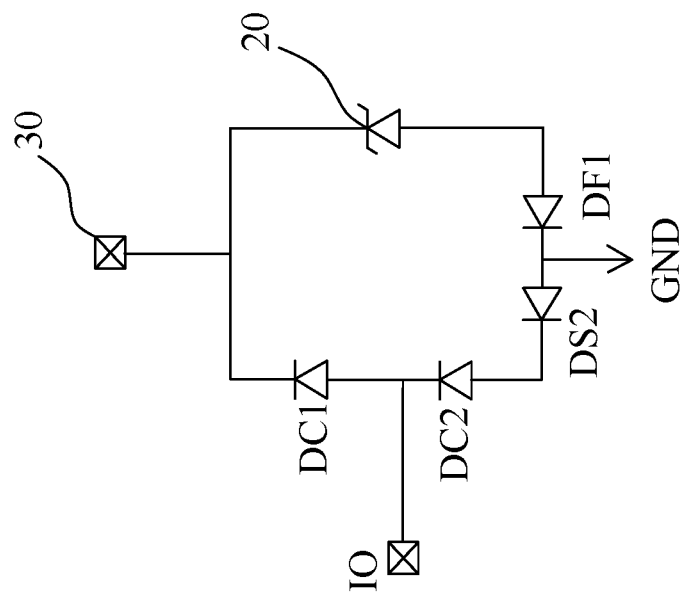
FIG. 11 shows a circuit diagram of a transient voltage suppressor in accordance with a seventh embodiment of the present invention.

Moreover, according to the present invention, this novel transient voltage suppressor with ultra-low capacitance can be further applied to a variety of technical fields. As such, the power clamp circuit may be a BJT (Bipolar junction transistor, BJT), SCR (Silicon controlled rectifier, SCR) or zener diode depending on its application, respectively. For example, FIG. 11 shows a seventh embodiment that the power clamp circuit 20 can be a zener diode.

As a result, to sum up, the present invention certainly provides a novel and inventive ultra-low capacitance transient voltage suppressor which have never been seen or proposed ever before. The proposed circuit structure can be further applied to a multi-channel scheme for multi-channel use. When employing the proposed transient voltage suppressor structure, it is believed that a much lower capacitance while compared to the prior arts can be successfully accomplished. Moreover, since a uni-direction design is maintained, the negative clamping voltage will not be increased. Also, when it is applied to multi-channel transient voltage suppressor components, the layout area of the circuit structure can significantly be reduced, thereby decreasing fabricating costs and complexity as well.

Thus, the Applicants assert that the present invention is instinct, effective and highly competitive for incoming technology, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A multi-channel transient voltage suppressor with ultra-low capacitance, comprising:
   a plurality of diode strings coupled between an ESD bus line and a ground, wherein each of said plurality of diode strings is connected in parallel with each other and comprises at least two channel diodes connected in series;
   a plurality of I/O pins, wherein each of said plurality of I/O pins is coupled to a terminal where said at least two channel diodes adjacently connected in each of said plurality of diode strings are connected;
   a power clamp circuit coupled to said ESD bus line;
   a first diode having an anode coupled to said power clamp circuit and a cathode coupled to said ground; and
   a second diode having an anode coupled to said ground and a cathode coupled to a common anode of said plurality of diode strings, and said first diode in series with said power clamp circuit being connected with said plurality of diode strings in series with said second diode.

2. The multi-channel transient voltage suppressor with ultra-low capacitance according to claim 1, wherein said power clamp circuit is BJT, SCR or zener diode.

3. The multi-channel transient voltage suppressor with ultra-low capacitance according to claim 1, wherein said ESD bus line is coupled to a high voltage level or simply as a floating node.

4. The multi-channel transient voltage suppressor with ultra-low capacitance according to claim 1, wherein each of said plurality of diode strings further comprises a plurality of said channel diodes, and each of said plurality of I/O pins is disposed at said terminal in a middle of said plurality of said channel diodes such that said plurality of said channel diodes are divided equally.

5. The multi-channel transient voltage suppressor with ultra-low capacitance according to claim 1, wherein when a positive pulse is injected, an energy discharge current successively flows from at least one of said plurality of I/O pins, said channel diode of at least one of said plurality of diode strings, said power clamp circuit and said first diode to said ground.

6. The multi-channel transient voltage suppressor with ultra-low capacitance according to claim 1, wherein when a negative pulse is injected, an energy discharge current successively flows from said ground, said second diode and said channel diode of at least one of said plurality of diode strings to at least one of said plurality of I/O pins.

* * * * *